United States Patent [19]
Platz

[11] 4,012,088
[45] Mar. 15, 1977

[54] MONITORING AND CONTROL ARRANGEMENT

[75] Inventor: Winfried Platz, Rathsberg, Germany

[73] Assignee: Siemens Aktiengesellschaft, Berlin & Munich, Germany

[22] Filed: June 28, 1974

[21] Appl. No.: 484,464

[30] Foreign Application Priority Data

Sept. 19, 1973  Germany .......................... 2347179

[52] U.S. Cl. .............................. 312/198; 312/254; 312/278
[51] Int. Cl.² ................... A47B 47/00; A47B 77/00
[58] Field of Search ........... 297/248, 249; 312/198, 312/201, 203, 253, 254, 277; 108/60, 64

[56] References Cited

UNITED STATES PATENTS

| | | | |
|---|---|---|---|
| 2,264,491 | 12/1941 | Ward | 297/249 X |
| 2,612,421 | 9/1952 | Bargen | 312/198 X |
| 2,871,073 | 1/1959 | Swanson | 108/64 X |
| 2,995,408 | 8/1961 | Kobrin | 108/64 X |
| 3,257,154 | 6/1966 | Lewis | 312/198 |
| 3,462,855 | 8/1969 | Cornish | 312/198 |
| 3,512,857 | 5/1970 | Butera | 312/198 |
| 3,669,494 | 6/1972 | Lohmeyer | 297/248 X |

FOREIGN PATENTS OR APPLICATIONS

| | | | |
|---|---|---|---|
| 548,940 | 7/1956 | Belgium | 312/198 |
| 2,210,389 | 9/1973 | Germany | |
| 1,290,216 | 3/1969 | Germany | 312/198 |
| 618,804 | 2/1949 | United Kingdom | 108/64 |

Primary Examiner—Casmir A. Nunberg
Attorney, Agent, or Firm—Hill, Gross, Simpson, Van Santen, Steadman, Chiara & Simpson

[57] ABSTRACT

A monitoring and control arrangement which includes a plurality of control desks each having control, measuring and monitoring elements. The arrangement is assembled of a suitable number of control desks which, on the one hand, permits the precise positioning of the control desks in an extended configuration along a wall and, on the other hand, in an arcuate form pursuant to ergonomic viewpoints.

4 Claims, 4 Drawing Figures

MONITORING AND CONTROL ARRANGEMENT

FIELD OF THE INVENTION

The present invention relates to a monitoring and control arrangement and, more particularly, to an arrangement which includes a plurality of control desks each having control, measuring and monitoring elements.

DISCUSSION OF THE PRIOR ART

A monitoring and control arrangement of the above-mentioned type has been described in German Patent Application No. P 22 10 389.5. The previously proposed arrangement consists of three components which are articulatably connected with each other. Thus, it becomes possible to assemble these components so as to extend along a wall, in front of a ray-screening protective window, or to arrange them approximately arcuately or curvedly about a stool or chair.

A disadvantage of the known arrangement consists of in that it in practice forms an inseparable unit. However, for smaller installations which are monitored and controlled through such an arrangement it is frequently sufficient to utilize a smaller number of control desk components for receiving the control, measuring and monitoring organs. Furthermore, a fully extended positioning of the individual components is, in the previously proposed arrangement, not possible in view of the configuration of the control surfaces.

SUMMARY OF THE INVENTION

Accordingly, it is an object of the present invention to provide a monitoring and control arrangement of the type described which may be assembled of a suitable number of control desks which, on the one hand, permits the precise positioning of the control desks in an extended configuration along a wall and, on the other hand, in an arcuate form pursuant to ergonomic viewpoints. The inventive arrangement may further be so constructed that, in accordance with need, a single desk may be used.

The objects of the present invention are inventively attained in that, due to the novel and unique configuration of the control surface of each desk it becomes possible to so arrange a plurality of desks in an extended form, whereby the end edges facing towards the operating personnel lie along a straight line. In view of the cabinet-like construction of the inventive arrangement, any suitable number of control desks may be combined.

A particularly advantageous embodiment of the invention is provided for, when in the extended positioning of a plurality of desks, generally triangularly-shaped insert cover portions are located in the spaces present between the individual control surfaces. In this construction, the plurality of extended desks provide a continuous and approximately horizontally located control surface without disturbing interspaces.

In another constructional arrangement, the control desks are formed with upstanding portions including generally vertical side surfaces which project upwardly from the control surfaces, with the side surfaces being in contiguous relationship when the desks are in an extended position and being spaced when the desks are in an arcuate position, and include insert cover portions adapted to be located between the side surfaces in the latter position of the desks. This construction of the inventive arrangement forms a closed, compact monitoring and control arrangement for the arcuate or curved positioning of a plurality of control desks.

BRIEF DESCRIPTION OF THE DRAWINGS

Further advantages and details of the invention may now be ascertained from the following description of an exemplary embodiment, taken in conjunction with the accompanying drawing; in which.

DETAILED DESCRIPTION

Figure 1:
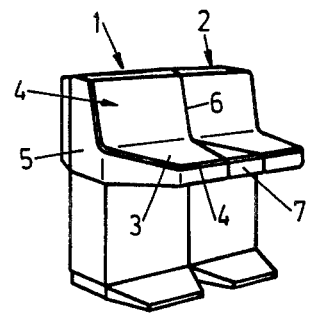
FIGS. 1 and 2 illustrate a monitoring and control arrangement according to the invention showing two control desks in, respectively, extended and arcuate positions.
Figure 2:
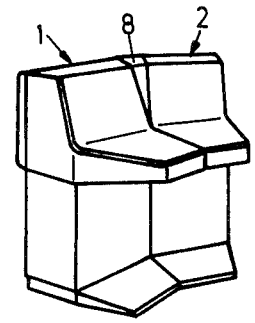

Referring now in detail to the drawings, the arrangement shown in FIGS. 1 and 2 consists of two control desks 1 and 2 which, in a known manner, incorporate control, measuring and monitoring elements for an installation such as, for example, a nuclear-medicine examining installation. In this instance there may, for example, be provided on the control desks 1 and 2 a viewing apparatus for representing the picture which is produced by a gamma camera, control elements for the gamma camera, as well as further elements for the control of nuclear-medicine apparatus, and for formulating the findings. Each of the control desks 1 and 2 is constructed as an independent unit, and includes an approximately horizontally located control surface, in which there are located at least a part of the control, measuring and monitoring elements. This control surface of desk 1 is designated by reference numeral 3. The desk 2 is constructed in a similar manner to desk 1. The control surface 3 is a regularly-shaped trapezoid, in which the smaller of the parallel sides 4 forms the end edge of the control desk facing towards the operating personnel. Each control desk further includes an upwardly extending portion projecting from the horizontal control surface, which is designated by reference numeral 4 on the control desk 1, and which is defined by means of two substantially vertically extending, mutually parallel located side surfaces 5 and 6, as shown in FIG. 1.

The extended positioning of the control desks 1 and 2 in accordance with FIG. 1 may be selected when the arrangement is to be located along a wall. In this instance, respectively two of the side surfaces of control desks 1 and 2, namely the side surface 6 and the thereto adjacent side surface of control desk 2, are positioned in contact with each other. The front edges (reference numeral 4 for desk 1) of the control desks which extend towards the operating personnel lie along a straight line.

In order to fill the interspace between the horizontal control surfaces of the control desks, a generally triangularly shaped cover portion 7 may be inserted in the space between the control surface 3 and the corresponding control surface of desk 2. In that manner, there is formed a continuous horizontal control surface.

The curved or arcuate positioning of the control desks 1 and 2 according to FIG. 2 is selected when the control desks 1 and 2 are to be arranged about a working location, for example, a stool or chair, so as to be grouped pursuant to ergonomic viewing points. The arcuate or curved positioning becomes feasible when the cover portion 7 is removed. In order to obtain a compact, closed unit, the interspace between the side surface 6 and the thereto adjacent side surface of operating panel 2 is filled with a cover portion 8.

In the construction pursuant to FIG. 1, the control desks 1 and 2 may be screwed together with each other, and with the cover portion 7. In the positioning according to FIG. 2, the control desks 1 and 2 may be screwed together with each other, and with the cover portion 8.

Figure 3:
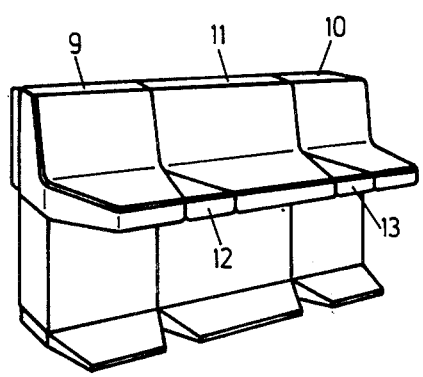
FIGS. 3 and 4 illustrate a monitoring and control arrangement according to the invention showing three control desks similarly shown in, respectively, extended and arcuate positions.
Figure 4:
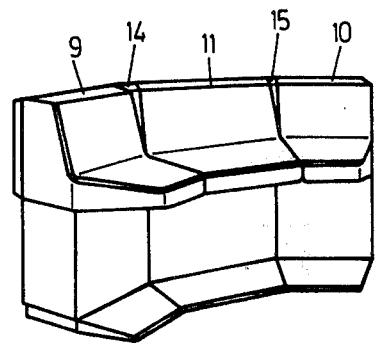

The arrangement as shown in FIGS. 3 and 4 of the drawing, includes two control desks 9 and 10, which correspond with the control desks 1 and 2 of FIGS. 1 and 2. Intermediate the control desks 9 and 10, there is located a control desk 11 which, if desired, may be wider than the control desks 9 and 10. In the extended position of the control desks 9 through 11, as shown in FIG. 3, two cover portions 12 and 13 are inserted between, respectively, the control desks 9 and 11 and 10 and 11 whereby, in this instance, there is also formed continuous approximately horizontal control surface. These cover portions 12 and 13 are removed in the curved position of the arrangement, pursuant to FIG. 4. In order to achieve a compact unit, in the curved positioning, two cover portions 12 and 14 are introduced between, respectively, desks 9 and 10 and 10 and 11, which each correspond to the cover portion 8 shown in FIG. 2.

In the embodiment according to FIGS. 3 and 4, the control desks 9 through 11 may also be screwed together with each other, and as required, with the inserted cover portions 12 and 13 and, respectively, cover portions 14 and 15.

Due to the construction of each of the control desks 1 and 2 and, respectively, 9 through 11 as independent units, it is thus possible to provide the inventive monitoring and control arrangement with the number of control desks which conform to any particular requirement. Thus, for example, four or even a larger number of control desks may be arranged in an extended or curved relationship. Furthermore, it is possible to utilize, for smaller installations which have to be monitored and controlled, a single one of the control desks.

For purposes of clarity, in FIGS. 2 through 4, the control, measuring and monitoring elements on control desks 1, 2, 9, 10 and 11, have been omitted from the drawing.

While there has been shown what is considered to be the preferred embodiment of the invention, it will be obvious that modifications may be made which come within the scope of the disclosure of the specification.

What is claimed is:

1. In a monitoring and control arrangement including a plurality of control desks supporting control, measuring and monitoring elements, each of said desks having a substantially horizontally positioned control surface, and said desks being constructed so as to be selectively arranged in an extended position or curved about a working location, the improvement comprising; each said control desk forming an independent component, said horizontal control surface of each said desk being a generally regularly-shaped trapezoid, the smaller of the parallel sides of said trapezoid forming the forward end edge of said control desk facing towards the operating personnel for said arrangement; generally triangular spaces being formed between adjacent horizontal control surfaces of said control desks in the extended positioning of the latter; and triangularly-shaped cover members positioned in said spaces, said cover members having upper surfaces substantially coplanar with said horizontal control surfaces so as to form a continuous control surfaces for said arrangement.

2. An arrangement as claimed in claim 1, each said control desk having a vertical portion extending upwardly from said horizontal control surfaces thereof, said vertical portions each having approximately vertical mutually parallel side surfaces adapted to contact each other in the extended positioning of said desks and forming a generally triangular interspace therebetween in the curved positioning of said desks; and cover portions adapted to be positioned in said interspaces.

3. An arrangement as claimed in claim 1, said control desks being fastened to each other and to said cover members.

4. An arrangement as claimed in claim 2, said control desks being fastened to each other and to said cover portions.

* * * * *